United States Patent
Wambsganss et al.

(10) Patent No.: US 12,212,130 B2
(45) Date of Patent: Jan. 28, 2025

(54) SYSTEM AND METHOD FOR DETECTION AND ISOLATION OF ARC FAULT

(71) Applicant: Astronics Advanced Electronic Systems Corp., Kirkland, WA (US)

(72) Inventors: Warren J. Wambsganss, Snoqualmie, WA (US); Fred J. Potter, Trumbauersville, PA (US); Patrick W. Mills, Bradenton, FL (US)

(73) Assignee: Astronics Advanced Electronic Systems Corp., Kirkland, WA (US)

( * ) Notice: Subject to any disclaimer, the term of this patent is extended or adjusted under 35 U.S.C. 154(b) by 107 days.

(21) Appl. No.: 17/886,971

(22) Filed: Aug. 12, 2022

(65) Prior Publication Data
US 2023/0051020 A1     Feb. 16, 2023

Related U.S. Application Data

(60) Provisional application No. 63/232,468, filed on Aug. 12, 2021.

(51) Int. Cl.
*H02H 1/00*       (2006.01)
*G01R 31/52*      (2020.01)

(52) U.S. Cl.
CPC .......... *H02H 1/0015* (2013.01); *G01R 31/52* (2020.01)

(58) Field of Classification Search
CPC ...... H02H 1/0015; H02H 1/0092; H02H 7/26; G01R 31/52; G01R 19/16538; G01R 23/16; G01R 31/1227
USPC .......................................................... 361/42
See application file for complete search history.

(56) References Cited

U.S. PATENT DOCUMENTS

| | | | | |
|---|---|---|---|---|
| 5,578,931 | A | * | 11/1996 | Russell .............. G01R 31/1272 324/536 |
| 6,002,561 | A | * | 12/1999 | Dougherty ........... H02H 1/0015 361/102 |
| 6,625,550 | B1 | | 9/2003 | Scott et al. |
| 8,493,754 | B1 | | 7/2013 | Wambsganss et al. |
| 9,411,003 | B2 | * | 8/2016 | Danesh ................ H02H 1/0015 |
| 2011/0012607 | A1 | | 1/2011 | Kojori et al. |
| 2020/0076364 | A1 | * | 3/2020 | Poyil .................. G01R 31/1227 |
| 2020/0191856 | A1 | | 6/2020 | Peralta et al. |

FOREIGN PATENT DOCUMENTS

| | | | | |
|---|---|---|---|---|
| CN | 112088475 | A | * 12/2020 | ........... G01R 31/085 |
| EP | 3048684 | A1 | * 7/2016 | ............. G01R 17/02 |
| WO | WO-2017221493 | A1 | * 12/2017 | ............. G01R 31/08 |
| WO | WO-2018150696 | A1 | * 8/2018 | ............. G01R 31/12 |

OTHER PUBLICATIONS

International Search Report and Written Opinion, PCT/US2022/040187, mailed Nov. 30, 2022.

* cited by examiner

*Primary Examiner* — Dharti H Patel
(74) *Attorney, Agent, or Firm* — Wiggin and Dana LLP

(57) ABSTRACT

An arc fault detection system senses current flow in a power source branch and in one or more load branches in an electrical system. Over a frequency range divided into a predetermined number of frequency bins, a controller records and tallies the branch having largest magnitude of power spectral density for each frequency bin. The branch having highest total tally is determined to be the branch in which the arc fault occurred and can then safely be isolated from the electrical system.

20 Claims, 4 Drawing Sheets

SYSTEM AND METHOD FOR DETECTION AND ISOLATION OF ARC FAULT

CROSS-REFERENCE TO RELATED APPLICATION

This application claims priority to U.S. Provisional Application No. 63/232,468, filed Aug. 12, 2021, which is herein incorporated by reference in its entirety.

TECHNICAL FIELD

This disclosure relates to a system and method for detecting the origin of an arc fault signal. The disclosure relates more particularly to a system and a method for isolating an arc fault to a single load.

BACKGROUND

Arcing is a serious and potentially hazardous phenomenon that occurs in electrical wiring when a path or gap of sufficiently low resistance presents itself between exposed conductors at different voltage potentials, causing electrical energy to jump, or arc, across that path or gap. Arcing may degrade or damage electric circuitry, generate radio frequency noise, and ignite flammable materials nearby. The danger of arcing is especially acute on aging aircraft where wire insulation may have deteriorated or where vibrations may have caused terminal connections to loosen over time. The bundling of wires due to spacing constraints further exacerbates the dangers of arcing on an aircraft.

With the increased drive toward the more electric aircraft (MEA) and the use of 270VDC and higher DC distribution voltages on aircraft, there is increasing concern over the safety of these high power systems. Unlike AC power, DC power does not have natural zero crossings in voltage and current. Because of this, once an electrical arc occurs across a short gap, the air in the arc remains ionized and conductive, preventing the arc from being quenched. A sustained arc in series with an electrical load, or series arc fault, will generate a significant amount of heat that will damage electrical wiring, create smoke and fire, and present a hazard to the aircraft. Because of this, there is significant motivation to have techniques of detecting and isolating series arc faults in a DC power system. The detection is typically performed by analyzing voltage and or current wave forms for an arc signature, with current signatures being the most reliably detected. When detecting electrical arc fault current signatures in a large system, the usual challenges apply, such as dealing with high ambient electrical noise generated from various ordinary noise sources, complex system impedances, and the low level of some arc fault signatures. However, the greatest challenge is determining the source of the arc fault signature so that an appropriate response can be coordinated for isolation of the arc fault without unnecessarily shutting down parts of the system that do not contain the arc fault. This disclosure reveals a technique for isolating an arc fault signature to a single electrical load so that only one load is shut down.

A typical arc detector is disclosed in U.S. Pat. No. 6,625,550, issued Sep. 23, 2003 and entitled "Arc Fault Detection For Aircraft," by Scott et al., which is incorporated by reference herein in its entirety. This detector is limited to detection only, however, and lacks the ability to locate the origin of an arc fault and to isolate only the circuit branch in which the arc fault has been detected.

Another arc detector is disclosed in U.S. Pat. No. 7,834,637, issued Nov. 16, 2010 and entitled "Method and Apparatus for Generalized AC and DC Arc Fault Detection and Protection," by Kojori et al., also incorporated by reference herein in its entirety. The disclosed method for detection of an arc fault uses a running discrete Fourier series (RFDS) processor to sense variations in magnitude of a fundamental component of current and an $i^2t$ processor to sense an overload condition. As above, this method too lacks the ability to locate the origin of an arc fault and to isolate only the circuit branch in which the arc fault has been detected.

Arcing in wiring is a potentially catastrophic situation that has proven to be difficult to detect and isolate reliably with existing methods. A method is needed for the simple, quick and accurate detection of arcing in an electrical circuit. Moreover, the method must robustly determine the source of the arc fault signature so that a single fault may be isolated without turning off non-faulted electrical connections.

The subject matter of the present disclosure is directed to detecting the origin of an arc fault signal. The disclosure relates more particularly to a system and a method for isolating an arc fault to a single load or single branch of a power system.

SUMMARY

The capability to isolate an arc fault to a single branch of a large power system is of particular importance in systems that use an array of electronic breakers to provide arc fault detection and mitigation. When a series arc fault occurs, the fault must be detected, isolated to a single load, and power removed from that load typically in less than 200 msec in order to prevent propagation of an electrical failure and/or damage to the aircraft. Detection of the presence of an arc fault is straight-forward, and has been shown to be possible in related art. What has continued to be difficult, however, is the isolation of the electrical fault to a single electrical branch where the arc fault is present. This capability is of particular importance when an array of breakers implements arc fault detection and mitigation. The current induced in a single branch of a power system due to the presence of an arc fault will also conduct through all other electrical branches connected to the faulted branch.

BRIEF DESCRIPTION OF DRAWINGS

The features and advantages of this disclosure will be more fully understood with reference to the following, more detailed description, when taken in conjunction with the accompanying figures.

Like reference numbers and designations in the various drawings indicate like elements.

DETAILED DESCRIPTION

Reference will now be made in detail to describe the exemplary embodiments of this disclosure, which are illustrated in the accompanying drawing. Specific details disclosed herein are not to be interpreted as limiting, but rather as a basis for the claims and teaching one skilled in the art how the present invention could be employed in any appropriately detailed system, structure or manner. The same reference numbers will be used throughout the drawings to refer to the same or like components, circuits or functions.

Figure 1:
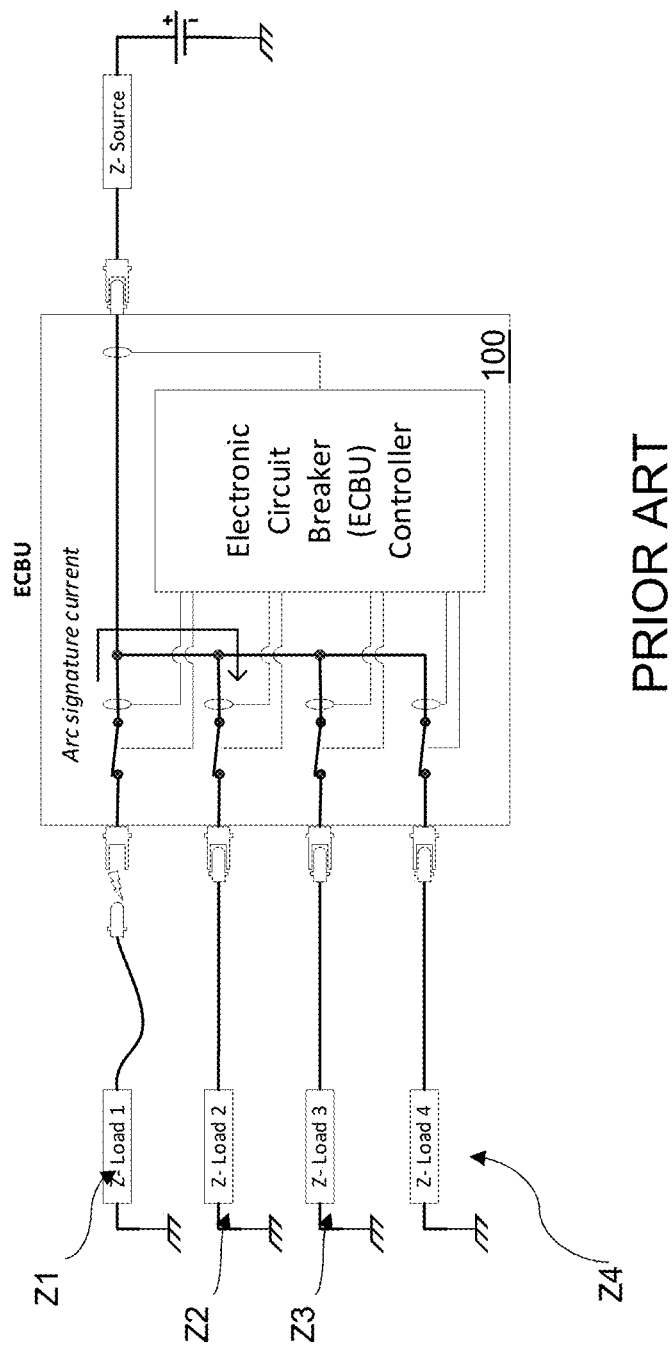
FIG. 1 is a circuit diagram of an embodiment of an electronic circuit breaker controller (ECBU).

FIG. 1 shows a conventional ECBU 100 with arc detection capability connected to four loads (Load 1, Load 2, Load 3, and Load 4) Z1, Z2, Z3, Z4. An arc occurring in series with a first load (Load 1) Z1 creates an AC current arc signature that may conduct through any of the other electrical circuits connected to the DC power bus. The path this current takes depends on the relative AC impedances of the different electrical paths available in the electrical system. For example, if a second load (Load 2) Z2 has a very low AC input impedance compared to the other loads and the power source, most of the arc fault current generated by the first load Z1 will travel through the second load Z2. Because of this, the current signatures measured at first load Z1 and second load Z2 will be very similar. In reality, the current will be divided between all of the different electrical branches, but it will not be divided evenly and the signature will typically exceed the trip threshold for one or more of the other loads being monitored, meaning that multiple loads will be turned off when a single arc fault occurs. Alternatively, an arc fault originating in a completely different part of the electrical system may still cause the signature to be conducted to these loads, leading to them being erroneously turned off.

With a configuration as shown in FIG. 1, however, detection of the phase relationship of the arc fault noise will not not possible since the noise is stochastic and broadband in nature. Any attempt to derive the phase of random noise results in unusable phase information. A method must be developed that robustly determines the source of the arc fault signature so that a single fault may be isolated without turning off non-faulted electrical connections.

The key characteristic of an arc fault signature is the presence of broadband noise. In order to detect an arc fault signature, blocks of sampled current data are first converted to the frequency domain using the Fast Fourier Transform (FFT). After the FFT is performed, the power spectral density (PSD) is calculated over small frequency intervals, or bins, across the full measurement frequency range. The PSD of each frequency bin is compared to a previously determined limit for that bin. If a large enough fraction of the bin limits are exceeded over a long enough period of time, an arc fault is determined to be present. There will always be some noise present in a real power system, so it is likely that a small number of bins will exceed the PSD limits at any one time, but only truly broadband noise associated with an arc fault will exceed the majority of the bins over a long time period.

The present disclosure makes use of the fact that arc fault currents will have one origin, but their return path will be split over multiple electrical paths in a branching power system. Kirchhoff's current law states that current flowing into a junction must equal the current flowing out of it. As a consequence, the arc fault signature current generated by the first load Z1 in FIG. 1 will be divided in the return path by the other connected load impedances and the impedance of the power source. Each of the electrical branches shown has a different impedance over frequency, and the current signal will be divided over the other branches by the relative ratio of the impedances.

Figure 2:
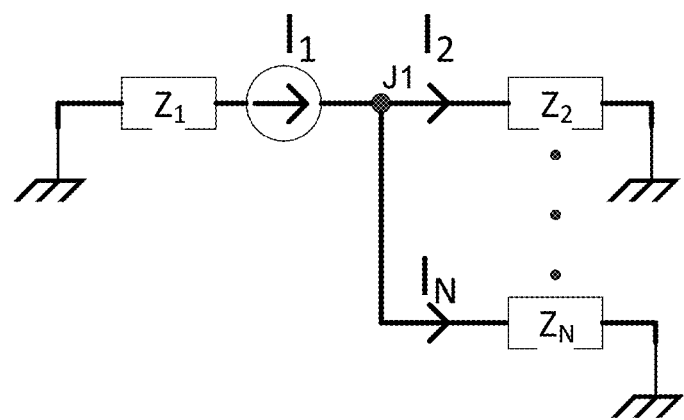
FIG. 2 is a generalized circuit diagram of a current divider.

FIG. 2 shows an exemplary current divider circuit and EQTN. 1 below is a representation of Kirchoff's current law in accordance with FIG. 2, where N is the total number of electrical branches connected to a junction J1 and I(f)$_1$ is the current generated by the electrical branch that contains a series arc fault over frequency.

$$I(s)_1 = \sum_{n=2}^{N} I(s)_n \qquad \text{EQTN. 1}$$

Moreover, EQTN. 2 below represents the currents contained in each electrical branch connected to the junction J1 over frequency. It is important to recognize that the impedances of each electrical branch change over the measurement frequency range, so the ratio of currents in each electrical branch will likewise change over frequency.

$$I(s)_n = I(s)_1 \frac{1}{Z(s)_n} * \frac{1}{\sum_{m=2}^{N} \frac{1}{Z(s)_m}} \qquad \text{EQTN. 2}$$

For a single source of arc fault current and with three or more electrical branches connected to the junction J1, the source of the current may be determined as the highest amplitude current connected to the junction J1. With two or more other branches through which the current could travel, besides the signal source, the current will be split between the two or more potential return paths by the ratio of the impedances in each path. The signal source will always be the electrical branch with the highest amplitude.

Figure 3:
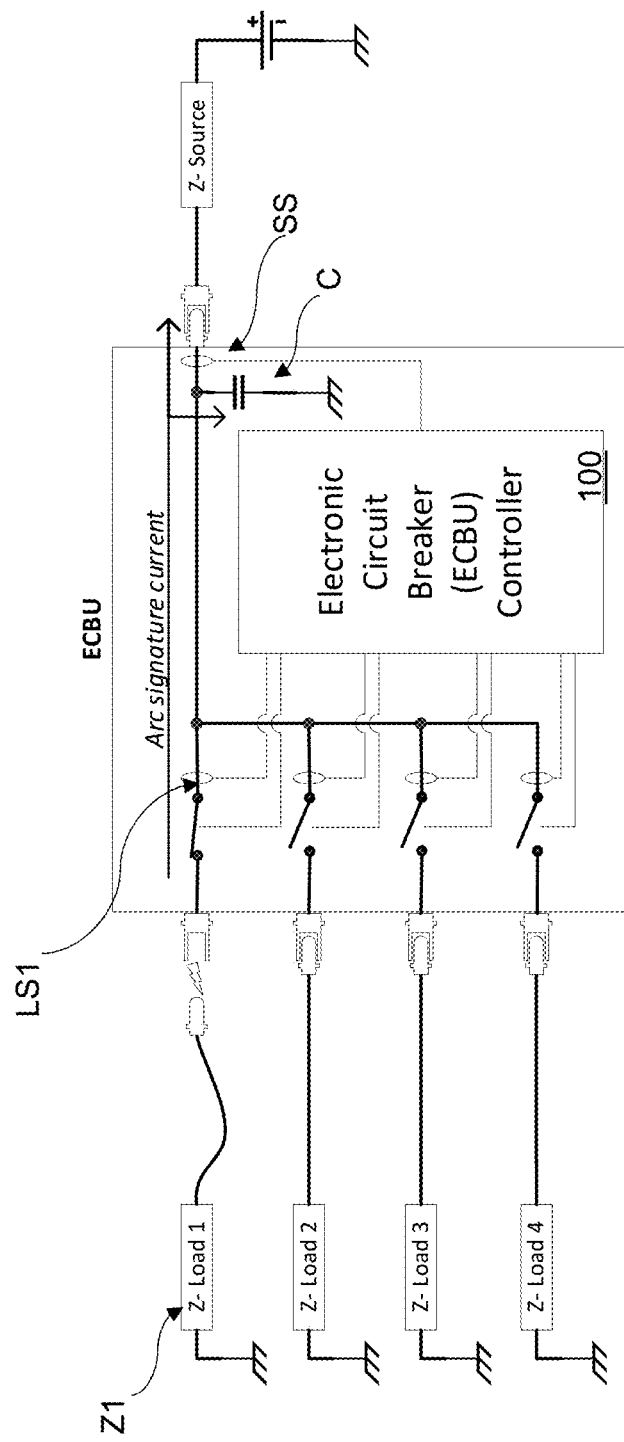
FIG. 3 is a circuit diagram on an embodiment of an ECBU with an added capacitor in accordance with the disclosure.

For the special situation where only two branches, one of which is an electrical load and the other is a power source, are connected to the junction J1, the current signal from the arc and the power source will be identical, and no conclusions may be reached as to the source of the arc signature. Thus, in order to be able to identify the source of the arc signature in this case, another intentional electrical path must be added to the junction. FIG. 3 shows an embodiment of an ECBU configuration with a small capacitor C added. Because of feeder inductance and the inductance of the generator, the Z-Source will be relatively high in impedance, particularly at high frequency. The added capacitor C serves as the return path for some of the arc induced current. Now, between the Load 1 current sensor LS1 and the Source current sensor SS, the origin of the arc fault current may be determined to be the Load 1 connection by comparison of the current magnitudes, and not due to an arc fault somewhere else in the power system.

In a typical power system, there will be individual loads that emit narrow band currents into the power system due to normal operation. Moreover, certain types of equipment, such as motor drives and switch mode power converters, may produce very high amplitude narrow band emissions. The arc fault detection algorithm must not be influenced by the normal emissions from individual electrical loads when determining the source of an arc fault signature, so an overall current amplitude measurement, such as RMS current, is not useful for determination of the source of an arc current signature. Detection of the source of an arc fault requires comparison of current amplitudes in each branch in an electrical circuit over the full measurement frequency range. This comparison of the relative amplitudes between all of the current sensors for individual loads and the power source over the full frequency is key to detecting the true source of the arc fault signature. The following algorithm may be used to determine the source of an arc fault signature.

1) Assign a count variable ($CNT_n$) to each monitored current. Initially set all count variables to 0.
2) Once an arc fault is determined to be present somewhere in the power system, compare the PSD magnitudes for the lowest frequency bin between all of the sensed currents. The last sampled data set which resulted in the determination of the presence of an arc should be used for this purpose.
3) Increment the count of the monitored current with the highest PSD magnitude for the lowest frequency bin.
4) Repeat steps 2 and 3 for the next higher frequency bin. Repeat this process until the highest frequency bin is reached and the relative magnitudes compared.
5) Compare the magnitude of the count variables between all of the sensed currents. The monitored current with the highest count is determined to be the source of the arc fault signature.
6) If the source of the arc fault signature is one of the connected loads, disconnect that load to isolate the series arc fault. If the source of the arc fault signature is the power source, ignore the arc detection and continue monitoring.

It is not important which order is used, lowest to highest frequency, highest to lowest frequency or any other order, but the intent is to determine, over the full frequency range, which sensed current contains the arc signature most strongly. The sensed current that contains the highest magnitude over the full frequency range is determined to be the source of the arc signature.

Figure 4:
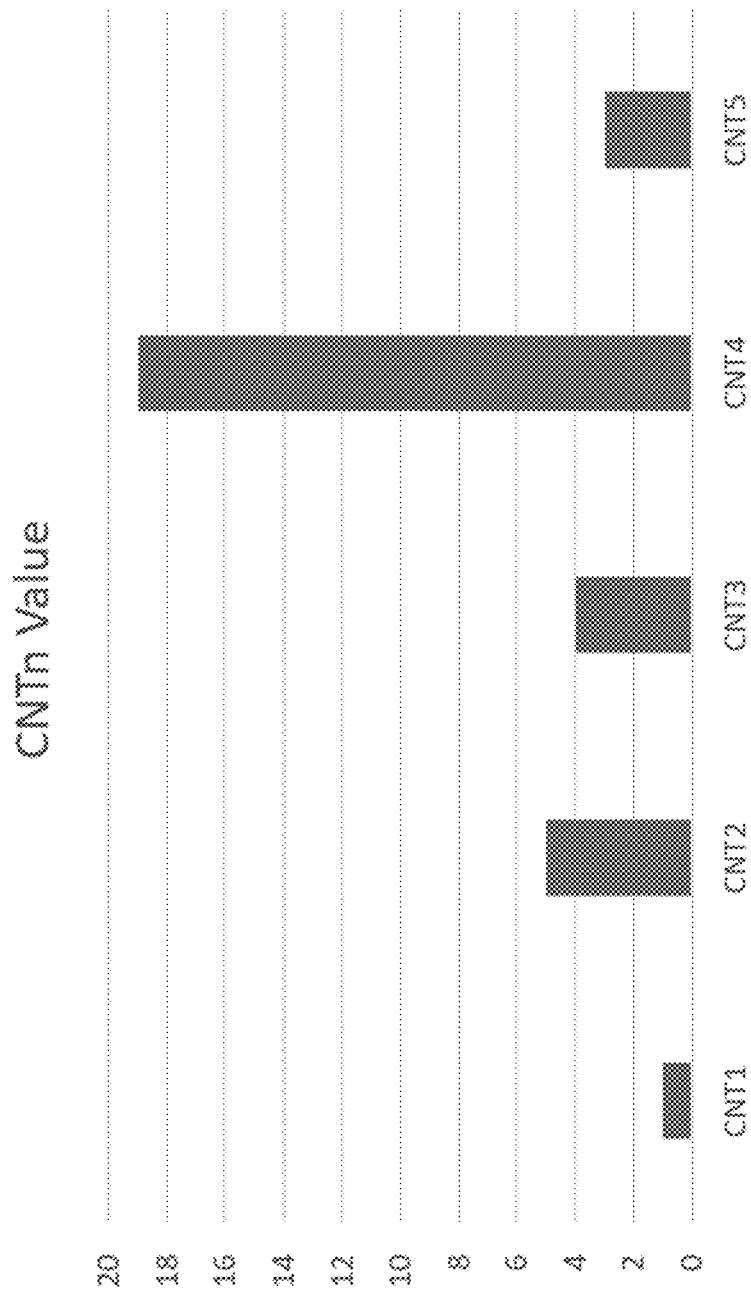
FIG. 4 is bar graph that shows count totals for each load branch in an exemplary electrical system, where each count total represents the number of frequency bins, over a full measurement frequency range, for which the sensed current in the corresponding load branch had the largest relative magnitude.

FIG. 4 shows count totals for an exemplary system. Since $CNT_4$ has the highest count, the sensed current corresponding to $CNT_4$ will be assigned as the source of the arc current signature. The other monitored currents may contain noisy loads that have a higher PSD over narrow frequency ranges, but if they do not contain an arc signature, they will not have the highest count value.

Although FIG. 3 shows an embodiment with four load branches, other embodiments with a different number of load branches are contemplated.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present invention. For instance, although the described embodiments relate to aircraft and particular ECBUs and load types, it should be understood that various embodiments in other environmental settings and with other numbers and types of loads are within the scope of the present disclosure.

What is claimed is:

1. A method for detecting an arc fault in an electrical circuit configured to supply electrical power to a plurality of loads, the method comprising the following steps:
monitoring a level of electrical current being supplied to each of the plurality of loads at each of a plurality of points in time;
for each of the plurality of points in time, converting each of the plurality of electric current levels to a corresponding frequency representation having a plurality of frequency components;
for each component of the frequency representation of each electric current level, for each of the plurality of loads determining a power spectral density for each frequency component;
comparing each power spectral density to a predetermined limit corresponding to each frequency component; and
indicating that an arc fault has occurred in connection with a particular load when a predetermined minimum number of power spectral densities exceed their corresponding limits for a predetermined minimum number of points in time for the particular load.

2. The method of claim 1, wherein the step of converting each of the plurality of electric current levels comprises performing a Fast Fourier Transform.

3. The method of claim 1, wherein each component of the frequency representation comprises a corresponding range of a plurality of individual frequencies.

4. A method for identifying a source of an arc fault in an electrical circuit configured to supply electrical power to a plurality of loads, the method comprising the following steps
monitoring a level of electrical current being supplied to each of the plurality of loads at a point in time;
converting each of the plurality of electric current levels to a corresponding frequency representation having a plurality of frequency components;
for each component of the frequency representation of each electric current level, for each of the plurality of loads, determining a power spectral density for each frequency component;
for each frequency component, identifying the corresponding load having a highest spectral density and
identifying the source of the arc fault as the load having the electrical current level which is determined to have the greatest number of highest spectral densities.

5. The method of claim 4, wherein the step of converting each of the plurality of electric current levels comprises performing a Fast Fourier Transform.

6. The method of claim 4, wherein each component of the frequency representation comprises a corresponding range of a plurality of individual frequencies.

7. The method of claim 4, further comprising the step of isolating the source of the arc fault.

8. The method of claim 4, further comprising the following steps:
assigning a count variable to each of the monitored currents corresponding to a load, and initially setting each count variable to zero;
identifying the monitored current corresponding to a load which has the highest spectral density for a particular range of individual frequencies, and incrementing the count variable for the identified current;
repeating the identifying step for one or more other frequency ranges; and
wherein the step of identifying the source of the arc fault is determined based on the monitored current having the highest count variable.

9. The method of claim 8, wherein the frequency ranges are arranged from low frequency to high frequency and the step of identifying the load with the highest spectral density is carried out from the low frequency range to the high frequency range.

10. The method of claim 8, wherein the frequency ranges are arranged from high frequency to low frequency and the step of identifying the load with the highest spectral density is carried out from the high frequency range to the low frequency range.

11. A method for detecting and identifying a source of an arc fault in an electrical circuit configured to supply electrical power to a plurality of loads, the method comprising the following steps:

monitoring a level of electrical current being supplied to each of the plurality of loads at each of a plurality of points in time;

for each of the plurality of points in time, converting each of the plurality of electric current levels to a corresponding frequency representation having a plurality of frequency components;

for each component of the frequency representation of each electric current level, for each of the plurality of loads determining a power spectral density for each frequency component;

comparing each power spectral density to a predetermined limit corresponding to each frequency component;

indicating that an arc fault has occurred in connection with a particular load when a predetermined minimum number of power spectral densities exceed their corresponding limits for a predetermined minimum number of points in time for the particular load;

for each frequency component, identifying the corresponding load having a highest spectral density identifying the source of the arc fault as the load having the electrical current level which is determined to have the greatest number of highest spectral densities.

12. The method of claim 11, wherein the step of converting each of the plurality of electric current levels comprises performing a Fast Fourier Transform.

13. The method of claim 11, wherein each component of the frequency representation comprises a corresponding range of a plurality of individual frequencies.

14. The method of claim 11, further comprising the step of isolating the source of the arc fault.

15. A system for detecting and identifying a source of an arc fault in an electrical circuit configured to supply electrical power to a plurality of loads, the system comprising:

a processor;

a memory containing instructions which when executed by the processor cause the processor to:

monitor a level of electrical current being supplied to each of the plurality of loads at each of a plurality of points in time;

for each of the plurality of points in time, convert each of the plurality of electric current levels to a corresponding frequency representation having a plurality of frequency components;

for each component of the frequency representation of each electric current level for each of the plurality of loads, determine a power spectral density for each frequency component;

compare each power spectral density to a predetermined limit corresponding to each frequency component;

indicate that an arc fault has occurred in connection with a particular load when a predetermined minimum number of power spectral densities exceed their corresponding limits for a predetermined minimum number of points in time for the particular load;

for each frequency component, identify the corresponding load having a highest spectral density;

identify the source of the arc fault as the load having the electrical current level which is determined to have the greatest number of highest spectral densities.

16. The system of claim 15, wherein the processor is further programmed to convert each of the plurality of electric current levels by performing a Fast Fourier Transform.

17. The system of claim 15, wherein each component of the frequency representation comprises a corresponding range of a plurality of individual frequencies.

18. The system of claim 15, wherein the processor is further programmed to isolate the source of the arc fault.

19. A system for detecting and identifying a source of an arc fault in an electrical circuit configured to supply electrical power to a plurality of loads, the system comprising:

a plurality of current sensors, each current sensor capable of monitoring a level of electrical current being supplied to a corresponding one of the plurality of loads at each of a plurality of points in time;

a signal processor operable for each of the plurality of points in time, to convert each of the plurality of electric current levels to a corresponding frequency representation having a plurality of frequency components;

the signal processor further operable for each component of the frequency representation of each electric current level for each of the plurality of loads, to determine a power spectral density for each frequency component;

a first comparator operable to compare each power spectral density to a predetermined limit corresponding to each frequency component;

an indicator capable of indicating that an arc fault has occurred in connection with a particular load when a predetermined minimum number of power spectral densities exceed their corresponding limits for a predetermined minimum number of points in time for the particular load;

a second comparator operable for each frequency component, to identify the corresponding load having a highest spectral density; and the second comparator further operable to identify the source of the arc fault as the load having the electrical current level which is determined to have the greatest number of highest spectral densities.

20. The system of claim 19, further comprising an isolator operable to isolate the source of the arc fault.

* * * * *